(12) United States Patent
Park et al.

(10) Patent No.: US 10,108,506 B2
(45) Date of Patent: Oct. 23, 2018

(54) CONTROLLER OF SEMICONDUCTOR MEMORY DEVICE AND METHOD OF OPERATING THE SAME

(71) Applicant: SK hynix Inc., Gyeonggi-do (KR)

(72) Inventors: Se Chun Park, Seoul (KR); Ie Ryung Park, Gyeonggi-do (KR); Dong Kun An, Gyeonggi-do (KR); Na Ra Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 131 days.

(21) Appl. No.: 15/215,321

(22) Filed: Jul. 20, 2016

(65) Prior Publication Data

US 2017/0242768 A1   Aug. 24, 2017

(30) Foreign Application Priority Data

Feb. 19, 2016   (KR) .......................... 10-2016-0019882

(51) Int. Cl.
*G06F 11/00* (2006.01)
*G06F 11/20* (2006.01)
*G06F 3/06* (2006.01)

(52) U.S. Cl.
CPC .......... *G06F 11/2069* (2013.01); *G06F 3/064* (2013.01); *G06F 3/0619* (2013.01); *G06F 3/0679* (2013.01); *G06F 2201/805* (2013.01)

(58) Field of Classification Search
CPC ............ G11C 16/3436; G11C 16/3454; G11C 16/3459; G06F 11/1008; G06F 11/1016; G06F 11/1048; G06F 11/1402; G06F 11/2069; G06F 3/0619; G06F 3/064; G06F 3/0679
See application file for complete search history.

(56) References Cited

U.S. PATENT DOCUMENTS

2009/0196092 A1* 8/2009 Jagasivamani ..... G06F 11/1048
                                                    365/163
2011/0271041 A1* 11/2011 Lee .................... G06F 12/0246
                                                    711/103

(Continued)

FOREIGN PATENT DOCUMENTS

KR   1020110121897   11/2011
KR   1020140142793   12/2014

*Primary Examiner* — Michael Maskulinski
(74) *Attorney, Agent, or Firm* — IP & T Group LLP (57) ABSTRACT

There are provided an electronic device, and more particularly, to a controller of a semiconductor memory device with an increased operation speed and a method of operating the same. The method of operating the controller configured to control the semiconductor memory device includes obtaining a recovery address in which recovered data stored in a page buffer of the semiconductor memory device in which the program fail is generated is to be stored, transmitting a recovery command requesting the semiconductor memory device to transmit the recovered data to the semiconductor memory device, and storing the recovered data in the recovery address. The obtaining of the recovery address, the transmitting of the recovery command, and the storing of the recovered data in the recovery address are simultaneously performed while a post-processing operation is performed on the program fail.

16 Claims, 6 Drawing Sheets

(56) References Cited

U.S. PATENT DOCUMENTS

| | | | |
|---|---|---|---|
| 2013/0097366 A1* | 4/2013 | Shim | G06F 12/0246 |
| | | | 711/103 |
| 2013/0117606 A1 | 5/2013 | Anholt et al. | |
| 2014/0136925 A1* | 5/2014 | Joo | G06F 11/1048 |
| | | | 714/764 |
| 2015/0340100 A1* | 11/2015 | Cai | G11C 16/3459 |
| | | | 365/185.03 |
| 2015/0348633 A1* | 12/2015 | Song | G11C 16/12 |
| | | | 365/185.19 |
| 2016/0185463 A1* | 6/2016 | Catton | B64D 43/00 |
| | | | 701/14 |
| 2017/0116083 A1* | 4/2017 | Park | G06F 11/142 |

* cited by examiner

CONTROLLER OF SEMICONDUCTOR MEMORY DEVICE AND METHOD OF OPERATING THE SAME

CROSS-REFERENCE TO RELATED APPLICATION

The present application claims priority under 35 U.S.C. 119(a) to Korean patent Application No. 10-2016-0019882, filed on Feb. 19, 2016, which is incorporated herein by reference in its entirety.

BACKGROUND

1. Field

An embodiment of the present invention relates to an electronic device and, more particularly, to a controller for a semiconductor memory device and a method of operating the same.

2. Description of the Related Art

Memory systems are widely used as data storage devices of digital devices such as computers, digital cameras, MP3 players, and smart phones. A memory system typically includes a semiconductor memory device for storing data and a controller for controlling the semiconductor memory device. A digital device is operated by a host of the memory system and the controller transmits commands and data between the host and the semiconductor memory device.

The semiconductor memory device is typically implemented by forming one or more integrated circuits on a chip of a semiconductor material, such as, for example, silicon (SI), germanium (Ge), gallium arsenide (GaAs), and indium phosphide (InP). Semiconductor memory devices are largely categorized into volatile memory devices and nonvolatile memory devices.

In a volatile memory device, when the power supply to the device is cut off, any stored data therein are removed. Example of volatile memory devices include a static random access memory (SRAM), a dynamic RAM (DRAM), or a synchronous DRAM (SDRAM). In a nonvolatile memory device, even when the power supply to the memory device is cut off, stored data therein are maintained. A nonvolatile memory device may be a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM). A flash memory is divided into NOR and NAND flash memories.

SUMMARY

A controller configured to control a semiconductor memory device in which program fail is generated according to an embodiment of the present invention includes a processor configured to perform a post-processing operation on the program fail, a fail controller configured to transmit a recovery command requesting the semiconductor memory device to transmit recovered data stored in a page buffer of the semiconductor memory device in which the program fail is generated to the semiconductor memory device and to obtain a recovery address of a buffer memory in which the recovered data is to be stored while the post-processing operation is performed, and a memory controller configured to receive the recovery address from the fall controller and to store the recovered data received from the semiconductor memory device in the recovery address.

A method of operating an operation of a controller configured to control a semiconductor memory device in which program fail is generated according to an embodiment of the present invention includes obtaining a recovery address in which recovered data stored in a page buffer of the semiconductor memory device in which the program fail is generated is to be stored, transmitting a recovery command requesting the semiconductor memory device to transmit the recovered data to the semiconductor memory device, and storing the recovered data in the recovery address. The obtaining of the recovery address, the transmitting of the recovery command, and the storing of the recovered data in the recovery address are simultaneously performed while a post-processing operation is performed on the program fail.

According to the embodiment of the present invention, there are provided a controller of a semiconductor memory device with an increased operation speed and a method of operating the same.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The present invention will now be described more fully with reference to the accompanying drawings, in which exemplary embodiments of the inventive concept are shown. The inventive concept may, however, be embodied in many different forms and should not be construed as being limited to the described embodiments set forth herein. Rather, these embodiments are provided so that this disclosure will be thorough and complete, and will fully convey the invention to one of ordinary skill in the relevant art to which this invention pertains.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the inventive concept.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted as described above.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art to which this inventive concept belongs.

In describing the present invention, technical details which are well known in the art to which the present invention pertains and technical details not directly related to described embodiment may be omitted. This is done to prevent obscuring the present invention with unnecessary details.

Hereinafter, embodiments of the present invention will be described in detail with reference to the accompanying drawings.

Figure 1:
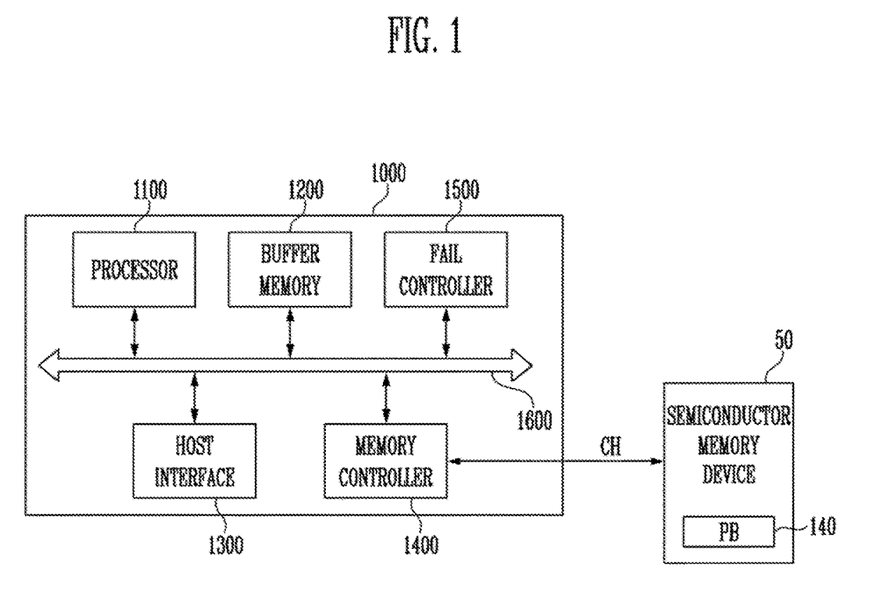
FIG. 1 is a block diagram illustrating a configuration of a memory system including a semiconductor device coupled to a controller, according to an embodiment of the invention.
Figure 2:
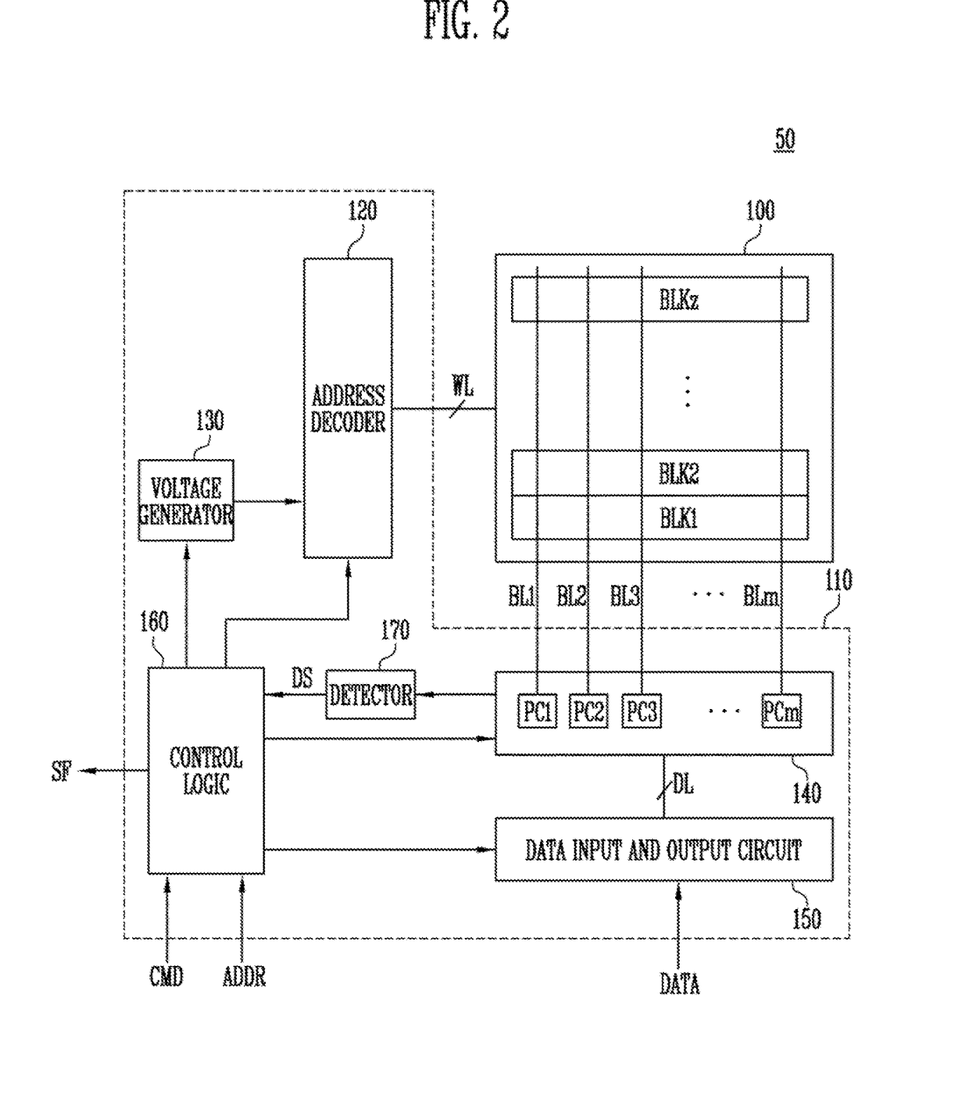
FIG. 2 is a block diagram illustrating an example configuration for the semiconductor memory device of FIG. 1.

Referring now to FIGS. 1 and 2 a memory system is provided, according to an embodiment of the present invention.

According to the embodiment of FIG. 1, the memory system includes a semiconductor memory device 50 coupled to a controller 1000.

The semiconductor memory device 50 may be a nonvolatile memory device. For example, the semiconductor memory device may be a NAND flash memory, a vertical NAND flash memory, a NOR flash memory, a resistive random access memory (RRAM), a phase-change RAM (PRAM), a magneto-resistive RAM (MRAM), a ferroelectric RAM (FRAM), or a spin transfer torque RAM (STT-RAM). The semiconductor memory device 50 may have a three-dimensional array structure. In an embodiment the semiconductor device may be a flash memory. Moreover, it is noted, that the present invention may be applied to a charge trap flash (CTF) in which a charge storage layer is formed of an insulating layer as well as a flash memory device in which a charge storage layer is formed of a conductive floating gate (FG).

The semiconductor memory device 50 includes a page buffer (PB) 140.

The semiconductor memory device 50 communicates with the controller 1000 through a channel CH. The semiconductor memory device 50 may transmit data stored in the page buffer 140 to the controller 1000 in response to a request of the controller 1000. For example, the controller 1000 may transmit a recall command to the semiconductor memory device 50 in order to recall the data stored in the page buffer 140.

Referring now to FIG. 2, the semiconductor memory device 50 includes a memory cell array 100 and a peripheral circuit 110 including the page buffer 140.

The memory cell array 100 includes a plurality of memory blocks BLK1 to BLKz. The plurality of memory blocks BLK1 to BLKz are connected to an address decoder 120 through word lines WL. The plurality of memory blocks BLK1 to BLKz are also connected to the page buffer 140 through bit lines BL1 to BLm. Each of the plurality of memory blocks BLK1 to BLKz includes a plurality of pages. The plurality of pages are respectively connected to the word lines WL. Each page includes a plurality of memory cells.

A program operation and a read operation of the semiconductor memory device 50 are performed in units of pages. An erase operation of the semiconductor memory device 50 is performed in units of memory blocks.

The peripheral circuit 1100 includes the address decoder 120, a voltage generator 130, the page buffer 140, a data input and output circuit 150, a control logic 160, and a detector 170.

The address decoder 120 is connected to the memory cell array 110 through the word lines WL. The address decoder 120 operates in response to control of the control logic 160.

The address decoder 120 may receive an address ADDR through the control logic 160. The program operation of the semiconductor memory device 50 is performed in units of word lines. During the program operation, the address ADDR includes a block address and a row address.

The address decoder 120 decodes the block address in the received address ADDR. The address decoder 120 selects one of the memory blocks BLK1 to BLKz in accordance with the decoded block address.

The address decoder 120 decodes the row address in the received address ADDR. The address decoder 120 selects one word line of the memory block selected in accordance with the decoded row address. Therefore, one page is selected including a plurality of memory cells linked to a word line.

According to an embodiment, the address decoder 120 may include an address buffer, a block decoder, and a row decoder.

The voltage generator 130 generates a plurality of voltages by using an external power source voltage supplied to the semiconductor memory device 50. The voltage generator 130 operates in response to the control of the control logic 160.

According to an embodiment, the voltage generator 130 may generate an internal power source voltage by regulating the external power source voltage. The internal power source voltage generated by the voltage generator 130 is used as an operating voltage of the semiconductor memory device 50.

The page buffer 140 includes first to mth page buffer circuits PC1 to PCm. The first to mth page buffer circuits PC1 to PCm are connected to the memory cell array 110 through first to mth bit lines BL1 to BLm. The first to mth page buffer circuits PC1 to PCm are connected to the data input and output circuit 150 through data lines DL. The first to mth page buffer circuits PC1 to PCm operate in response to the control of the control logic 160.

During a program, the first to mth page buffer circuits PC1 to PCm receive program data DATA through the data input and output circuit 150. The first to mth page buffer circuits PC1 to PCm transmit the program data DATA to the selected page through the bit lines BL1 to BLm. A memory cell connected to a bit line to which a program allowing voltage (for example, a ground voltage) is applied has an increased threshold voltage. A threshold voltage of a memory cell connected to a bit line to which a program preventing voltage (for example, a power source voltage) is applied is maintained. During program verification, the first to mth page buffer circuits PC1 to PCm read page data from the selected page through the bit lines BL1 to BLm.

The control logic 160 is connected to the address decoder 120, the voltage generator 130, the page buffer 140, the data input and output circuit 150, and the detector 170. The control logic 160 receives a command CMD and the address ADDR from the controller 1000. The control logic 160 controls the address decoder 120, the voltage generator 130, the page buffer 140, the data input and output circuit 150, and the detector 170 in response to the command CMD. The control logic 160 transmits the address ADDR to the address decoder 120.

The detector 170 is connected to the page buffer 140 and the control logic 160. The detector 170 operates in response to the control of the control logic 160.

During the program verification, the page data read from selected memory cells are temporarily stored in the first to mth page buffer circuits PC1 to PCm. The first to mth page buffer circuits PC1 to PCm may generate pass/fail bits representing whether data bits of the page data coincide with data bits of the program data DATA in response to the control of the control logic 160. The pass/fail bits represent whether the selected memory cells are in desired voltage states and the program operation is completed. The generated pass/fail bits are transmitted to the detector 170.

The detector 170 enables a detect signal DS when the number of data bits corresponding to program pass among the pass/fail bits is larger than a predetermined number. The detector 170 disables the detect signal DS when the number of data bits corresponding to the program pass among the pass/fail bits is smaller than or equal to a predetermined number.

The control logic 160 controls the peripheral circuit 110 to re-perform the program operation when the detect signal DS is disabled. Until the detect signal DS is enabled, the program and the program verification are repeatedly performed. When the program and the program verification form one program loop, a plurality of program loops are performed. That the detect signal DS is enabled means that the program operation is completed. The control logic 160 outputs a state signal SF representing the program pass. When the detect signal DS is disabled although a predetermined number of program loops are performed, the control logic 160 may output the state signal SF representing a program fail. The state signal SF is provided to the controller 1000 through a corresponding channel (refer to CH of FIG. 1).

Referring to FIG. 1 again, the controller 1000 may include a processor 1100, a buffer memory 1200, a host interface (I/F) 1300, a memory controller 1400, a fall controller 1500, and an internal bus 1600.

The processor 1100 controls an entire operation of the controller 1000. The processor 1100 drives firmware (FW) for controlling the semiconductor memory device 50. For example, the processor 1100 operates the firmware, such as, a flash translation layer (FTL). When a request is received from a host (not shown) through the host interface 1300, the processor 1100 may generate a physical block address corresponding to the corresponding request. The processor 1100 converts a logic block address included in the request into the physical block address. When the request from the host is a program request, program data is further received from the host. The processor 1100 stores the physical block address, the program data, and a write command corresponding to the program request in the buffer memory 1200. The write command, the physical block address, and the program data that are stored in the buffer memory 1200 are transmitted to the semiconductor memory device 50 by the memory controller 1400. The semiconductor memory device 50 may be specified by the physical block address. The write command is provided as the command CMD of FIG. 2. The physical block address is provided as the address ADDR of FIG. 2. The program data is provided as the program data DATA of FIG. 2.

The processor 1100 manages a command queue including commands transmitted to the semiconductor memory device 50. The command queue may be managed by a first in first out method. The processor 1100 generates commands in accordance with requests of the host and inputs the generated command to the command queue. The commands input to the command queue are sequentially or randomly performed.

According to an embodiment, the processor 1100 generates a write command, a physical block address, and program data and may transmit the generated write command, physical block address, and program data to the semiconductor memory device 50 without requests of the host. For example, the processor 1100 generates a write command, a physical block address, and program data for background operations such as a program operation for wear leveling and a program operation for garbage collection and may give a command to write the background operations.

According to an embodiment, when the program fail occurs, the processor 1100 may perform a predetermined post-processing operation. The post-processing operation may include a plurality of operations according to an embodiment. The post-processing operation may include a bad block management operation.

According to an embodiment, the post-processing operation may include an operation of holding the command queue, reading the commands stored in the command queue, and re-generating the physical block address of the semiconductor memory device 50 for re-program operation of the program-failed data.

During or after the post-processing operation, the processor 1100 may obtain from the fall controller 1500 the recall address of the buffer memory 1200 at which the program-failed data is recalled. As described later, the processor 1100 may store the program-failed data recalled by the fail controller 1500 at the assigned recall address in the buffer memory 1200. The processor 1100 re-generates a command and a physical block address for storing the recalled data stored at the recall address of the buffer memory 1200 and may input the re-generated command and physical block address in the command queue. According to an embodiment, the processor 1100 may provide the fail controller 1500 with the physical block address of the semiconductor memory device 50 for the re-program operation of the recalled or program-failed data.

The buffer memory 1200 may serve as a working memory of the processor 1100 or a buffer memory between the semiconductor memory device 50 and the host Host. According to an embodiment, the buffer memory 1200 may serve as a cache memory between the semiconductor memory device 50 and the host Host or a buffer for temporarily storing data input from the semiconductor memory device 50. According to an embodiment, the buffer memory 1200 may include at least one of various random access memories (RAMs), such as, a static random access memory (RAM) (SRAM), a dynamic RAM (DRAM), a synchronous DRAM (SDRAM), a phase-change RAM (PRAM), a magnetic RAM (MRAM), a resistive RAM (RRAM), a ferroelectric RAM (FRAM), and a NOR flash memory.

When the program fail occurs, the buffer memory 1200 assigns the recall address for storing the program-failed data in response to a recall request of the fall controller 1500. According to an embodiment, a partial region of the buffer memory 1200 may be assigned for storing the recalled data in a predetermined manner. The buffer memory 1200 may store the program-failed data recalled by the fail controller 1500 at the assigned recall address.

The host interface 1300 includes a protocol for exchanging data between the host and the controller 1000. For example, the controller 1000 may communicate with the outside (the host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

The memory controller 1400 includes a protocol for providing an interface for communicating with the semiconductor memory device 50. For example, the memory interface 250 may include at least one of flash interfaces such as a NAND interface and a NOR interface.

The memory controller 1400 provides a path in which data transmitted to the semiconductor memory device 50 and data received from the semiconductor memory device 50 are processed. For example, the memory controller 1400 provides a read data path and a write data path. In the read data path, data read from the semiconductor memory device 50 is decoded by an error correcting code (ECC), and then stored in the buffer memory 1200. In the write data path, data to be stored in the semiconductor memory device 50 is encoded by the ECC and then transmitted to the semiconductor memory device 50 through the channel CH.

According to an embodiment, although not shown, the memory controller 1400 may include a plurality of semiconductor memory devices connected through a common channel.

When a program fail occurs, the fail controller 1500 performs a recall operation for recalling the program-failed data. The fail controller 1500 monitors the channel CH connected to the semiconductor memory device 50 and may sense the program fail. According to an embodiment, the program fail may be sensed based on the state signal SF provided from the semiconductor memory device 50.

When the program fail is sensed, the fall controller 1500 requests the buffer memory 1200 to provide the recall address in which the program-failed data is to be stored for the recall of the program-failed data. The buffer memory 1200 may assign the recall address in response to the recall request of the fail controller 1500. According to an embodiment, the recall address may be predetermined in order to store the recalled data. The fall controller 1500 may transmit the recall command requesting the semiconductor memory device 50 to transmit the program-failed data stored in the page buffer 140. According to an embodiment, the recall command may be a fast buffer release command. The fail controller 1500 requests the processor 1100 to store the recalled or program-failed data at the assigned recall address of the buffer memory 1200.

According to an embodiment, the fail controller 1500 may receive the physical block address of the semiconductor memory device 50 from the processor 1100 for the re-program operation of the recalled or program-failed data. The fail controller 1500 may transmit a command, an address, and data to the memory controller 1400 so that the recalled data is re-programmed at the received physical block address in the semiconductor memory device 50.

The internal bus 1600 provides a channel between elements of the controller 1000. For example, the internal bus 1600 may be a common channel for transmitting a command and data. According to various embodiments, the internal bus 1600 may include a command channel and a data channel for respectively transmitting the commands and the data.

The controller 1000 and the semiconductor memory device 50 may be integrated into one semiconductor device. According to an exemplary embodiment, the controller 1000 and the semiconductor memory device 50 are integrated into one semiconductor device and may form a memory card such as, a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and a universal flash memory device (UFS).

The controller 1000 and the semiconductor memory device 50 may be integrated into one semiconductor device and may form a semiconductor drive (a solid state drive (SSD)). The semiconductor drive (SSD) includes a storage device formed to store data in a semiconductor memory. When the memory system is used as the semiconductor drive (SSD), an operation speed of the host Host connected to the memory system remarkably increases.

According to another example, the memory system is provided as one of various elements of an electronic device such as one of various elements that form a computer, an ultra-mobile PC (UMPC), a work station, a net-book, a personal digital assistant (PDA), a portable computer, a web tablet, a wireless phone, a mobile phone, a smart phone, an e-book, a portable multimedia player (PMP), a portable gamer, a navigator, a black box, a digital camera, a three-dimensional television set, a digital audio recorder, a digital audio player, a digital picture recorder, a digital picture player, a digital video recorder, a digital video player, a device capable of transmitting and receiving information in a wireless environment, one of various electronic devices that form a home network, one of various electronic devices that form a computer network, one of various electronic devices that form a telematics network, an RFID device, or a computing system.

According to an embodiment, the semiconductor memory device 50 or the memory system may be mounted as a package in various forms. For example, the semiconductor memory device 50 or the memory system is packaged in a method such as package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multichip package (MCP), a wafer-level fabricated package (WFP), and a wafer-level processed stack package (WSP) and may be mounted.

Figure 3:
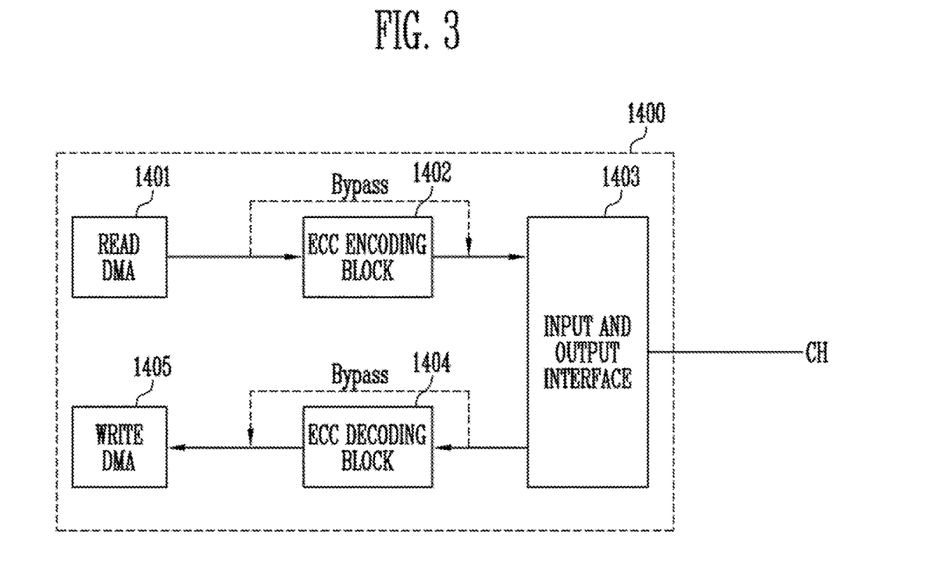
FIG. 3 is a view illustrating an example configuration of a memory controller employed in the controller of FIG. 1.

Referring to FIG. 3, the memory controller 1400 may include a read data path and a write data path.

The write data path includes a read direct memory access (Read DMA) 1401, an ECC encoding block 1402, and an input and output interface 1403.

The read data path includes the input and output interface 1403, an ECC decoding block 1404, and a write DMA 1405.

In the write data path, the read DMA 1401 reads program data stored in the buffer memory 1200. The read DMA 1401 transmits the read program data to the ECC encoding block 1402.

In the write data path, the ECC encoding block 1402 ECC-encodes the program data, generates parity bits, adds the generated parity bits to the program data, and generates ECC-encoded program data. The ECC encoding block 1402 transmits the ECC-encoded program data to the input and output interface 1403.

Various ECCs may be used, such as, for example, a Bose, Chaudhri, and Hocquenghem (BCH) code, a reed Solomon code, a Hamming code, and a low density parity check (LDPC) code.

In the write data path, the input and output interface 1403 transmits the ECC-encoded program data from the encoding block 1402 to the semiconductor memory device through the channel CH. At this time, a corresponding write command and the physical block address may be also transmitted.

According to an embodiment, the input and output interface 1403 includes a protocol for communicating with the semiconductor memory device coupled to the channel CH. For example, the input and output interface 1403 may include a NAND interface. In yet another example, the input and output interface may include a NOR interface.

In the read data path, the input and output interface 1403 receives the data read from the semiconductor memory device through the channel CH.

In the read data path, the ECC decoding block 1404 ECC-decodes the read data of the input and output interface 1403 and detects and corrects errors included in the read data.

In the read data path, the write DMA 1405 writes the ECC-decoded data of the ECC decoding block 1404 into the buffer memory 1200. According to an embodiment, the write DMA 1405 may write the program-failed or recalled data at the recall address of the buffer memory 1200.

According to an embodiment, when a program fail occurs in the read data path 1403, 1404, and 1405 then the program-failed data of the semiconductor memory device may be recalled in response to a recall command from the fail controller 1500. The recalled data may be previously encoded through the write data path 1401, 1402, and 1403 during the failed program operation. In addition, the recalled data may be output again through the write data path 1401, 1402, and 1403 during the re-program operation. According to an embodiment, the recalled data may bypass the ECC decoding block 1404 when the program-failed data is recalled through the read data path. When the recalled data is output again through the write data path during the re-program operation, the recalled data may bypass the ECC encoding block 1402.

Figure 4:
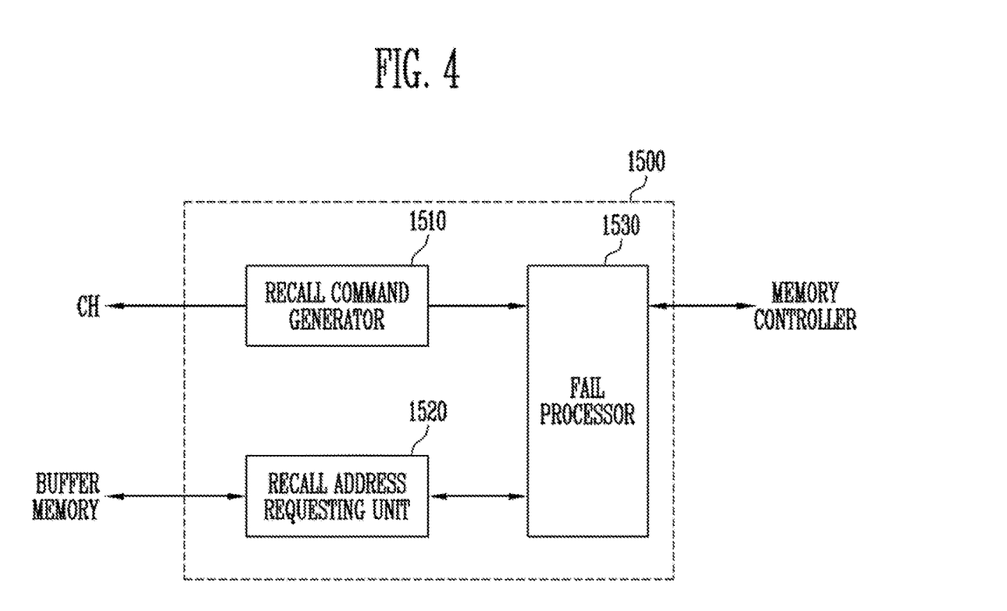
FIG. 4 is a view illustrating a fail controller of FIG. 1.

FIG. 4 illustrates an example configuration for the fail controller 1500 of FIG. 1.

Referring to FIG. 4, the fail controller 1500 may include a recall command generator 1510, a recall address requesting unit 1520, and a fail processor 1530.

When the fall processor 1530 senses a program fail, the recall command generator 1510 generates the recall command for recalling the program-failed data. According to an embodiment, the recall command may be a fast buffer release command requesting the semiconductor memory device 50 to provide the recalled data (i.e., the program-failed data) of the page buffer 140 to the buffer memory 1200.

The recall command generator 1510 may then transmit the recall command which was generated in accordance with the control of the fail processor 1530 to the semiconductor memory device 50 through the channel CH.

When the fall processor 1530 senses the program fall, the recall address requesting unit 1520 requests the buffer memory 1200 to assign the recall address for storing the recalled (program-failed) data. According to an embodiment, the recall address requesting unit 1520 may include information on the predetermined recall address for storing the recalled data.

The fall processor 1530 may control the entire operation of the fail controller 1500. The fail processor 1530 may sense the program fail through the memory controller 1400. According to an embodiment, the program fail may be sensed through the state signal SF transmitted by the semiconductor memory device 50. According to an embodiment, the fall processor 1530 may directly monitor the channel CH and may receive the state signal SF directly from the semiconductor memory device 50 through the channel CH.

When a program fall occurs, the fail processor 1530 controls the recall command generator 1510 to generate the recall command and then transmits the generated recall command to the semiconductor memory device 50.

Moreover, when the program fall occurs, the fail processor 1530 controls the recall address requesting unit 1520 for obtaining the recall address of the buffer memory 1200 for the recalled data. The fail processor 1530 may then request the processor 1100 to store the recalled data at the recall address of the buffer memory 1200.

The fail processor 1530 may provide the recall address, at which the recalled data is stored in the buffer memory 1200, to the processor 1100. According to various embodiments, the fail processor 1530 may receive the physical block address of the semiconductor memory device 50, at which the recalled data is to be re-programmed, from the processor 1100. The fail processor 1530 provides the recalled data of the buffer memory 1200 and the physical block address to the memory controller 1400 and may re-program the recalled data in the semiconductor memory device 50.

Figure 5:
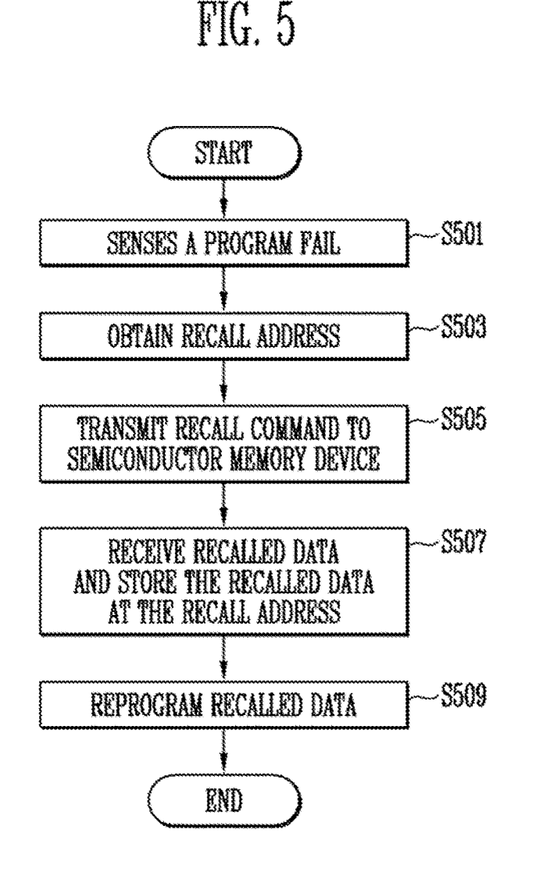
FIG. 5 is a flowchart illustrating an operation of the fail controller of FIG. 4, according to an embodiment of the present invention.

FIG. 5 is a flowchart illustrating an operation of the fail controller 1500, according to an embodiment of the present invention.

Referring to FIG. 5, in step S501, the fail controller 1500 senses a program fail. The fail controller 1500 may sense the program fail of the semiconductor memory device 50 through the state signal SF provided through the channel connected between the fail controller 1500 and the semiconductor memory device 50.

In step S503, the fail controller 1500 then obtains the recall address of the buffer memory 1200 in which the program-failed data is to be recalled and stored. Specifically, the fail controller 1500 may receive a partial address of the buffer memory 1200 as the recall address. According to an embodiment, the recall address may be predetermined for a partial region of the buffer memory 1200. The fail controller 1500 may provide the recall address to the processor 1100.

In step S505, the fail controller 1500 transmits the recall command requesting the semiconductor memory device 50 to recall the program-failed data stored in the page buffer 140. According to an embodiment, the recall command may be the fast buffer release command.

In step S507, the fail controller 1500 receives the recalled data from the semiconductor memory device 50 and stores the recalled data at the recall address of the buffer memory 1200. The fail controller 1500 may request the processor 1100 to store the recalled data at the recall address of the buffer memory 1200. The processor 1100 may store the program-failed data recalled by the fail controller 1500 at the provided recall address in the buffer memory 1200.

In step S509, the fail controller 1500 re-programs the recalled data. The fail controller 1500 may receive the physical block address of the semiconductor memory device 50 from the processor 1100. The fail controller 1500 provides the recalled data of the buffer memory 1200 and the physical block address to the memory controller 1400 and the memory controller 1400 may re-program the recalled data in the semiconductor memory device 50.

In an embodiment, a processor may control a controller to transmit the recall command and receive the recalled data through firmware. When the program fail occurs, the controller queues the recall command into the command queue. Since there are commands previously queued into the command queue, the processor must stop an operation of the command queue. The processor moves the commands queued in the command queue into a queue managed by the firmware, reorders the recall command and the moved commands according to a desired execution order in the queue managed by the firmware, and moves the reordered commands including the recall command from the queue managed by the firmware into the command queue. In addition, the processor performs a post-processing operation for the program fail. The processor performs the bad block management operation on the physical block address of a semiconductor memory device in which the program fall occurs and must regenerate a new physical block address in order to re-program the program-failed data. Such operations require a large amount of time and increase the power consumption and the load of the controller. Increase in the number of interrupts on the operation of the processor means an increase in the throughput of the processor.

According to an embodiment of the present invention, the fail controller 1500 independently receives the recall address from the processor 1100 and transmits the recall command. Therefore, the processor 1100 does not need to perform an operation related to transmission of the recall command and reception of the recalled data but may only perform the post-processing operation.

While the processor 1100 performs the post-processing operation, since the fail controller 1500 performs operations related to the recall command, the processing load of the processor 1100 is reduced. Therefore, controller 1000 can operate at an increased operation speed.

Figure 6:
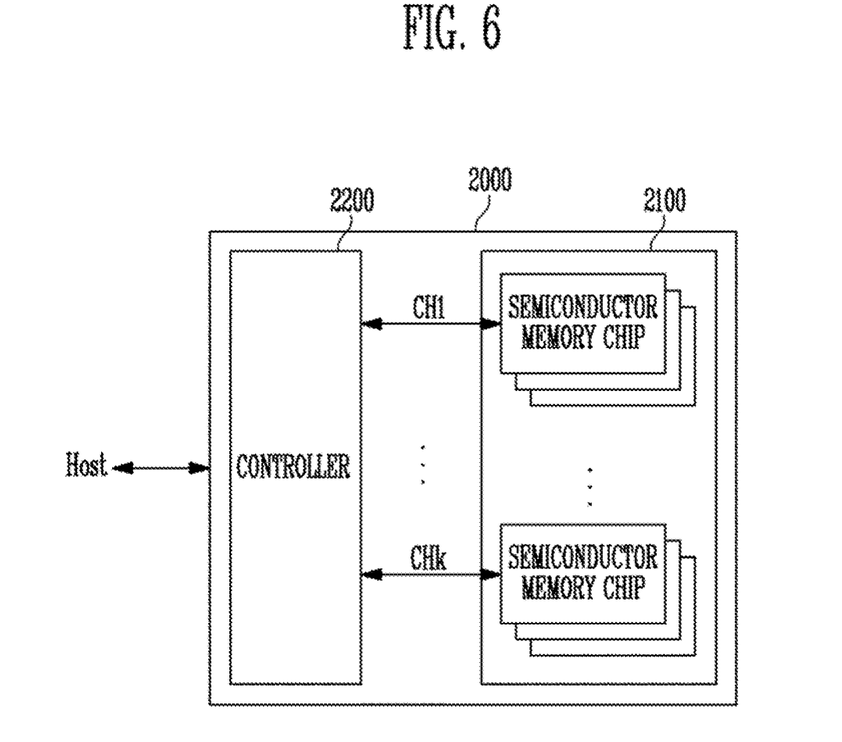
FIG. 6 is a block diagram illustrating an application example of the memory system of FIG. 1.

FIG. 6 is a block diagram illustrating an application example of the memory system of FIG. 1.

Referring to FIG. 6, the memory system 2000 includes a semiconductor memory device 2100, a controller 2200 and a host HOST. The semiconductor memory device 2100 includes a plurality of semiconductor memory chips. The plurality of semiconductor memory chips are divided into a plurality of groups.

In FIG. 6, it is illustrated that the plurality of groups respectively communicate with the controller 2200 through first to kth channels CH1 to CHk. Each semiconductor memory chip may be configured and operate like the semiconductor memory device 50 described with reference to FIG. 1.

The semiconductor chips in each group communicate with the controller 2200 through one common channel. The controller 2200 may be configured like the controller 1200 described with reference to FIG. 1 and may control the plurality of semiconductor memory chips of the semiconductor memory device 2100 through the plurality of channels CH1 to CHk.

In FIG. 6, it is illustrated that the plurality of semiconductor memory chips in each group are connected to a common channel. However, the memory system 2000 may be modified so that one semiconductor memory chip is connected to one channel.

Figure 7:
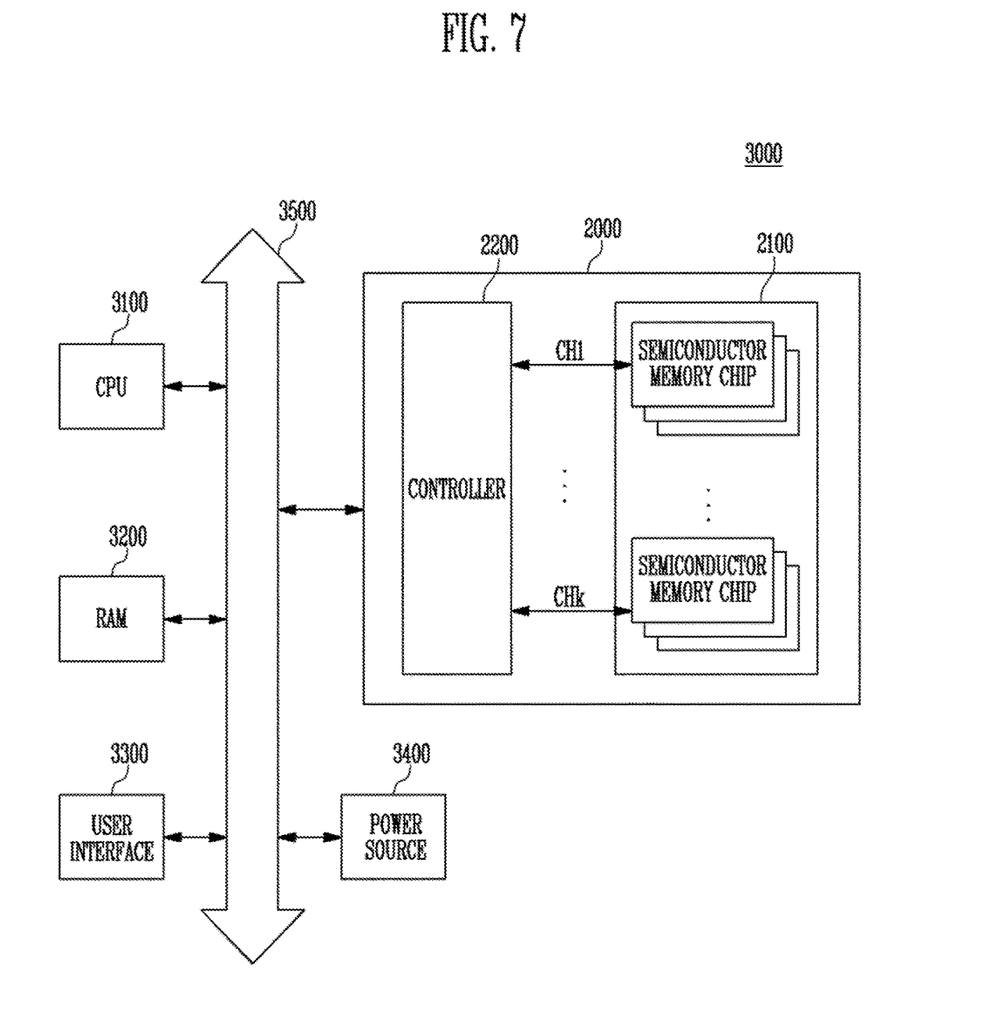
FIG. 7 is a block diagram illustrating a computing system including the memory system described with reference to FIG. 6, according to an embodiment of the present invention.

FIG. 7 is a block diagram illustrating a computing system 3000 including the memory system 2000 described with reference to FIG. 6.

Referring to FIG. 7, the computing system 3000 includes a central processing unit (CPU) 3100, a random access memory (RAM) 3200, a user interface 3300, a power source 3400, a system bus 3500, and the memory system 2000.

The memory system 2000 is electrically connected to the CPU 3100, the RAM 3200, the user interface 3300, and the power source 3400 through the system bus 3500. Data provided through the user interface 3300 or processed by the CPU 3100 may be stored in the memory system 2000.

In FIG. 7, the semiconductor memory device 2100 is illustrated as being connected to the system bus 3500 through the controller 2200. However, the semiconductor memory device 2100 may be directly connected to the system bus 3500, in which case, the functions of the controller 2200 may be performed by the CPU 3100 and the RAM 3200.

In FIG. 7, it is illustrated that the memory system 2000 described with reference to FIG. 6 is provided. However, the memory system 2000 may be replaced by the memory system described with reference to FIG. 1. According to an embodiment, the computing system 3000 may include both of the memory systems 1000 and 2000 described with reference to FIGS. 1 and 6.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A controller for a semiconductor memory device, the controller comprising:
    a processor suitable for performing a post-processing operation for a program fail of the semiconductor memory device;
    a fail controller suitable for providing to the semiconductor memory device a recall command requesting the semiconductor memory device to recall program-failed data of the semiconductor memory device, and obtaining a recall address of a buffer memory at which the recalled data is to be stored during the post-processing operation; and a memory controller suitable for storing the recalled data at the recall address in the buffer memory, wherein the buffer memory is included in the controller.

2. The controller of claim 1, wherein the post-processing operation includes one or more of a bad block management operation on a physical block address of the program fail or an operation of generating a physical block address for re-programming the recalled data of the buffer memory into the semiconductor memory device.

3. The controller of claim 1, wherein after the post-processing operation the memory controller obtains a physical block address from the fail controller and re-programs the recalled data at the physical block address of the semiconductor memory device.

4. The controller of claim 3, wherein, after the post-processing operation, the processor provides the fail controller with the physical block address for re-programming the recalled data in the semiconductor memory device.

5. The controller of claim 1, wherein the recall address is predetermined.

6. The controller of claim 1, wherein the fail controller comprises:
   a fail processor suitable for sensing the program fail;
   a recall command generator suitable for generating the recall command; and
   a recall address requesting unit suitable for receiving the recall address.

7. The controller of claim 6, wherein the fail processor senses the program fail from a channel connected to the semiconductor memory device.

8. The controller of claim 1, wherein the memory controller comprises:
   a write data path suitable for transferring data stored in the buffer memory to the semiconductor memory device; and
   a read data path suitable for transferring data received from the semiconductor memory device to the buffer memory.

9. The controller of claim 8,
   wherein the read data path includes an ECC decoding unit suitable for performing an ECC decoding operation to the data read from the semiconductor memory device, and
   wherein the memory controller bypasses the ECC decoding unit when the program-failed data is recalled through the read data path.

10. The controller of claim 8,
    wherein the write data path includes an ECC encoding unit suitable for performing an ECC encoding operation to the data provided from the buffer memory, and
    wherein the memory controller bypasses the ECC encoding unit when the recalled data is re-programmed through the write data path.

11. A method of operating a controller of a semiconductor memory device, the method comprising:
    sensing a program fail of the semiconductor memory device;
    obtaining a recall address of a buffer memory at which program-failed data of the semiconductor memory device is to be stored;
    providing the semiconductor memory device with a recall command requesting the semiconductor memory device to recall the program-failed data; and
    storing the recalled data at the recall address of the buffer memory,
    wherein the buffer memory is included in the controller and the obtaining of the recall address, the providing of the recall command, and the storing of the recalled data are performed during a post-processing operation for the program fail.

12. The method of claim 11, wherein the post-processing operation includes one or more of a bad block management operation on a physical block address of the program fail or an operation of generating a physical block address for re-programming the recalled data of the buffer memory into the semiconductor memory device.

13. The method of claim 11, further comprising re-programming the recalled data after the post-processing operation.

14. The method of claim 13, wherein the re-programming of the recalled data includes transferring the recalled data from the buffer memory to the semiconductor memory device by bypassing an ECC encoding operation.

15. The method of claim 11, wherein the storing of the recalled data includes transferring the program-failed data from the semiconductor memory device to the buffer memory by bypassing an ECC decoding operation.

16. The method of claim 11, wherein the recall address is predetermined.

* * * * *